United States Patent
Wang

(10) Patent No.: US 7,651,886 B2
(45) Date of Patent: Jan. 26, 2010

(54) SEMICONDUCTOR DEVICE AND MANUFACTURING PROCESS THEREOF

(75) Inventor: Jiun-Heng Wang, Tainan County (TW)

(73) Assignees: ChipMOS Technologies Inc., Hsinchu (TW); ChipMOS Technologies (Bermuda) Ltd., Hamilton (BM)

( * ) Notice: Subject to any disclaimer, the term of this patent is extended or adjusted under 35 U.S.C. 154(b) by 553 days.

(21) Appl. No.: 11/451,997

(22) Filed: Jun. 12, 2006

(65) Prior Publication Data
US 2007/0207608 A1    Sep. 6, 2007

(30) Foreign Application Priority Data
Mar. 1, 2006    (TW) ............... 95106753 A

(51) Int. Cl.
*H01L 21/44* (2006.01)
*H01L 21/48* (2006.01)
*H01L 21/50* (2006.01)

(52) U.S. Cl. ............... 438/106; 438/612; 257/774; 257/780; 257/270; 257/E21.231; 257/E21.492; 257/E21.499; 257/E21.585

(58) Field of Classification Search ............... 438/106, 438/107, 108, 110, 612, 613, 614, 735; 257/774, 257/780, 270
See application file for complete search history.

(56) References Cited

U.S. PATENT DOCUMENTS

| | | | | |
|---|---|---|---|---|
| 5,903,058 A | * | 5/1999 | Akram | 257/778 |
| 5,914,274 A | * | 6/1999 | Yamaguchi et al. | 438/690 |
| 6,211,052 B1 | * | 4/2001 | Farnworth | 438/614 |
| 2004/0005771 A1 | * | 1/2004 | Fan et al. | 438/613 |
| 2008/0093738 A1 | * | 4/2008 | Lin | 257/737 |

FOREIGN PATENT DOCUMENTS

| | | |
|---|---|---|
| CN | 1512566 A | 7/2004 |
| TW | 517367 | 1/2003 |
| TW | 092133255 | 11/2003 |

OTHER PUBLICATIONS

Chinese First Examination Report of China Application No. 2006100573009, dated Jan. 4, 2008.

* cited by examiner

*Primary Examiner*—David Nhu
(74) *Attorney, Agent, or Firm*—J.C. Patents

(57) ABSTRACT

A semiconductor device including a circuit structure and a protective layer is provided. The circuit structure has multiple contacts. The protective layer is located on the circuit structure and has multiple openings and multiple protrusions, wherein the contacts are exposed by the openings and the protrusions are located on the contacts.

9 Claims, 4 Drawing Sheets

SEMICONDUCTOR DEVICE AND MANUFACTURING PROCESS THEREOF

CROSS-REFERENCE TO RELATED APPLICATION

This application claims the priority benefit of Taiwan application serial no. 95106753, filed on Mar. 1, 2006. All disclosure of the Taiwan application is incorporated herein by reference.

BACKGROUND OF THE INVENTION

1. Field of the Invention

The present invention relates to a semiconductor device and a manufacturing process thereof. More particularly, the present invention relates to a semiconductor device in which the reliability of the electrical connection between the device and other electronic devices is enhanced and a manufacturing process of the semiconductor device.

2. Description of Related Art

Flip chip interconnect technology is a type of packing technology that provides a connection of a die to a printed circuit board, wherein a plurality of bumps is formed on a plurality of contacts on the die. The die is then flipped over, and the bumps are connected to the terminals on the printed circuit board to electrically connect the die to the printed circuit board via the bumps.

FIGS. 1A to 1C are schematic, cross-sectional views showing the steps for fabricating a bump on a contact of a die according to the prior art. As shown in FIG. 1A, a die 110 is first provided, wherein the die has an active surface 112. The die 110 also has a plurality of contacts 114, disposed on the active surface 112. A protective layer 120 is further formed on the active surface 112.

Continuing to FIG. 1B, subsequent to a photolithography/etching process, a plurality of openings 122 is formed in the protective layer 120, wherein these openings expose the contacts 114. It is worthy to note that the size of the openings 122 is smaller than the contacts 114. Accordingly, the protective layer 120 at the vicinity of each opening 122 has a protrusion P. A layer of under bump metallurgy (UBM) material 150 is formed on the protective layer 120 and the contacts 114. A photoresist layer 130 is then formed on the UBM material 150. Subsequent to a photograph/etching process, a plurality of openings 132 is formed in the photoresist layer 130, wherein these openings 132 expose the UBM material 150 at where the contacts 114 are disposed. Subsequent to electroplating gold in these openings, a plurality of gold bumps 140 is formed on the die 110, wherein these gold bumps 140 are electrically connected to the contacts 114 through the UBM material 150.

Continuing to FIG. 1C, the photoresist layer 130 is removed. Further using these bumps 140 as a mask, the UBM material 150 not covered by the gold bumps 140 is removed to form a die structure 100 having a plurality of gold bumps 140. It is also worthy to note that the region covered by the gold bump 140 also includes a ring of protrusion P on the protective layer 120. Accordingly, the gold bump 140 also includes a ring of protrusion Q, corresponding to the ring of protrusion P on the protective layer.

Referring to FIG. 2, FIG. 2 is schematic, cross-sectional view showing the convention fabrication method of a bump on a die that is electrically connected to a printed circuit board. Accordingly to the conventional technique, the printed circuit board 200 is electrically connected to the die 110 through an anisotropic conductive film (adhesive) 250 and a gold bump 140, wherein the anisotropic conductive film 250 has a plurality of granules 252 having a conductive interior and an insulating exterior. The printed circuit board 200 has a plurality of terminals 210.

When the printed circuit board 200 is electrically connected to the die 110 through the anisotropic conductive film 250 and the gold bumps 140, some of the granules 252 are pressured by the protrusion Q on each gold bump 140 and the terminals 210. The insulating exterior of the granules 252 at where pressure is being applied is fractured by the protrusions Q on the gold bumps 140 and the terminals 210 for the die 110 exposing the conductive interior. As a result, the conductive interior of the granules 252 can electrically connect to the protrusion Q and the terminals 210 through the fracture site of the insulating exterior in order for the die to electrically connect to the printed circuit board 200.

It is also important to note that the surface area of the protruded region Q of the gold bump 140 is very small. Using the conventional technique to electrically connect the gold bump 140 to the contact pad 210 via the anisotropic conductive film 250, the reliability of the electrical connection between the gold bumps 140 and the terminals 210 is lower.

SUMMARY OF THE INVENTION

Accordingly, the present invention provides a semiconductor device and a fabrication method thereof, wherein the effective area of electrical connection at the top of the gold bump disposed on the semiconductor device is increased.

The present invention provides a semiconductor device which includes a circuit structure and a protective layer. The circuit structure has a plurality of contacts. The protective layer is disposed on the circuit structure. The protective layer includes a plurality of openings and a plurality of protrusions, wherein the openings expose these protrusions and these protrusions are disposed over these contacts.

According to an embodiment of the present invention, the semiconductor device further includes a plurality of UBM pads and a plurality of bumps, wherein these UBM pads are disposed on the contacts and the protrusions, and the gold bumps are disposed on the UBM pads.

According to the semiconductor device of an embodiment of the present invention, the material of the bumps is gold, for example.

According to the semiconductor device of an embodiment of the present invention, each contact has one protrusion disposed thereon.

According to the semiconductor device of an embodiment of the present invention, the protrusion can be ring shape, strip shape, or block shape, for example.

According to the semiconductor device of an embodiment of the present invention, each contact has a plurality of protrusions disposed thereon.

According to the semiconductor device of an embodiment of the present invention, the protrusions can be ring shape, strip shape, block shape or a combination of the above, for example.

The present invention provides a fabrication method for a semiconductor device, wherein an circuit structure is first provided. The circuit structure includes a plurality of contacts. A layer of protective material is further formed to cover the circuit structure. The layer of protective material is then patterned to form a protective layer. The protective layer has a plurality of openings and a plurality of protrusions, wherein the openings expose the contacts and the protrusions are disposed on these contacts.

According to the fabrication method of a semiconductor device of an embodiment of the present invention, a layer of UBM material is formed over the contacts and the protrusions. A plurality of bulges is formed on the UBM material, wherein the positions of these bulges correspond to those of the protrusions. The UBM material not covered by the bulges is then removed.

According to the present invention, the contacts on the circuit structure has a plurality of protrusions, each bump disposed on each contact has a plurality of bulges corresponding to the protrusions. Further, the thickness of the bulges is substantially the same. Consequently, the electrical connection between the bumps a semiconductor device and the terminals of a printed circuit board has a higher reliability.

Several exemplary embodiments of the invention will now be described in detail with reference to the accompanying drawings. It is to be understood that the foregoing general description and the following detailed description of preferred purposes, features, and merits are exemplary and explanatory towards the principles of the invention only and are not restrictive of the invention, as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE PREFERRED EMBODIMENTS

Figure 1A:
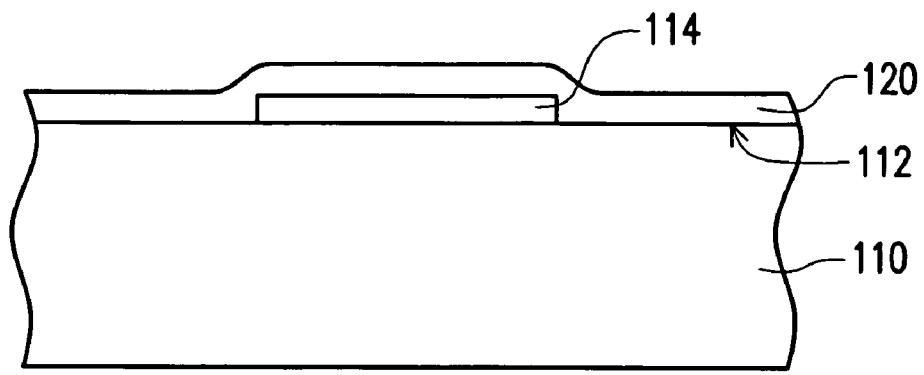
FIGS. 1A to 1C are schematic, cross-sectional views showing the steps for fabricating a bump on a contact of a die according to the prior art.
Figure 1B:
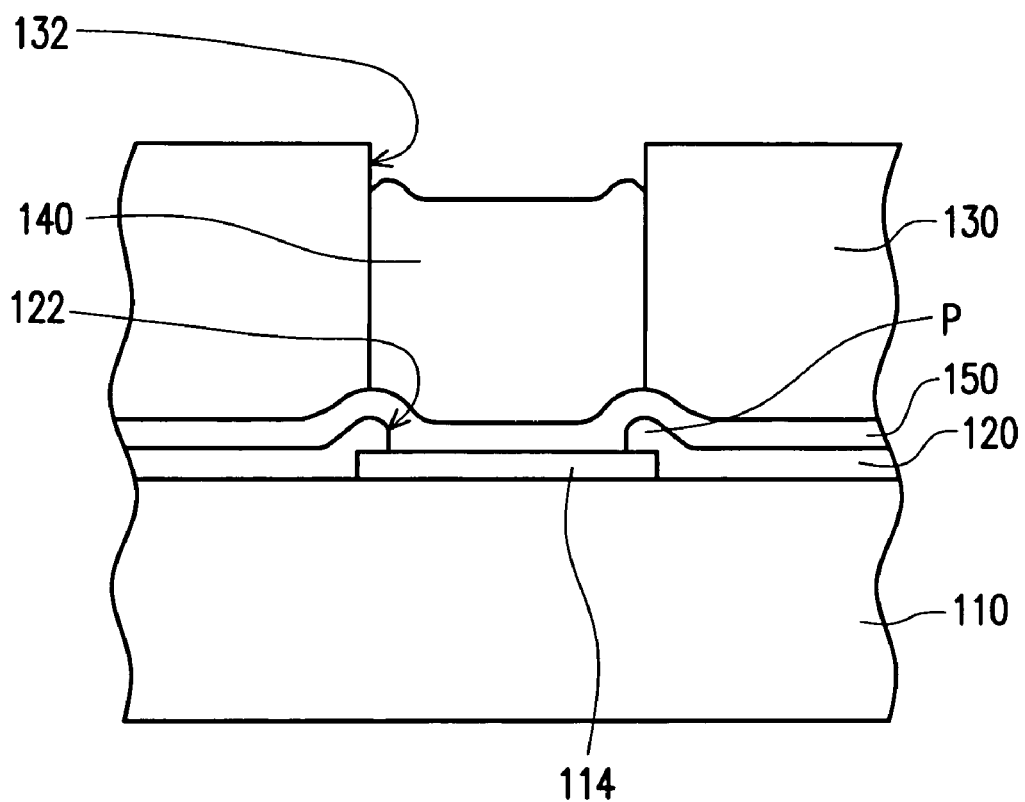
Figure 1C:
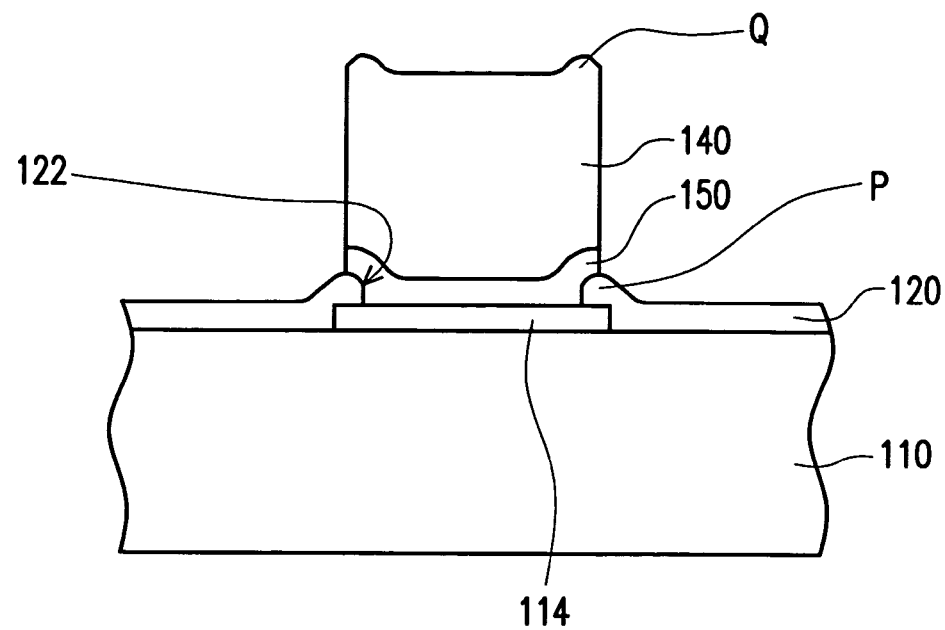
Figure 2:
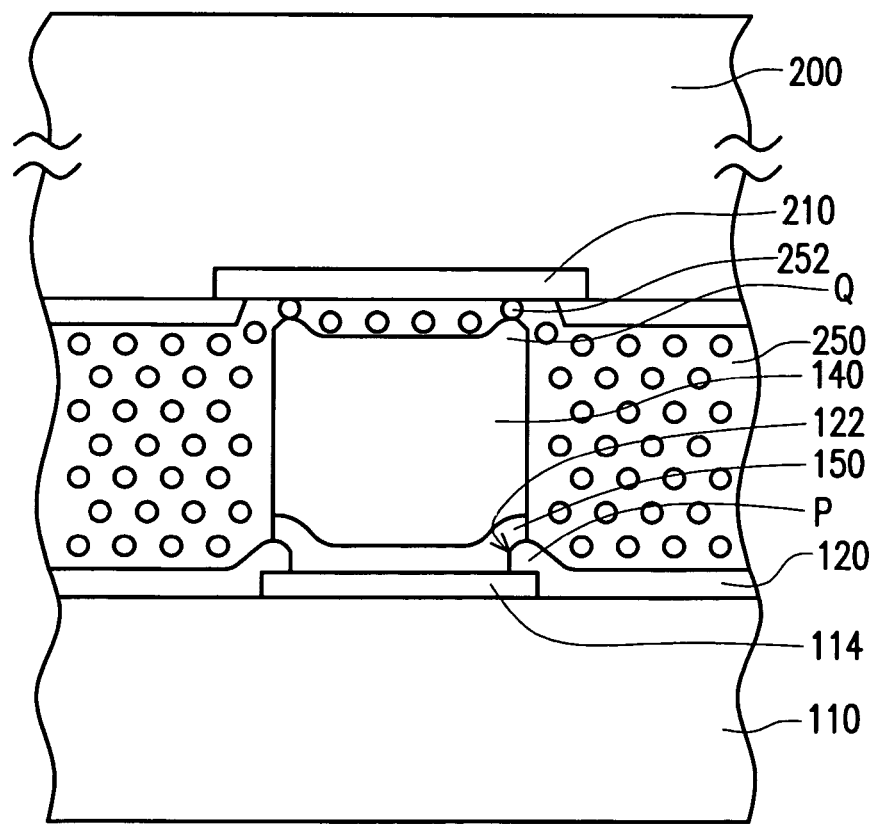
FIG. 2 is schematic, cross-sectional view showing the convention fabrication method of a bump on a die that is electrically connected to a printed circuit board.
Figure 3A:
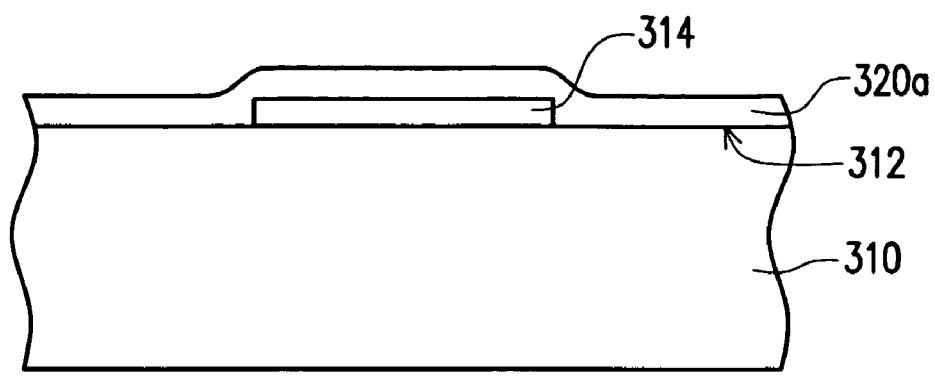
FIGS. 3A-3C are schematic, cross-sectional views showing the steps for fabricating a semiconductor device according to one embodiment of the present invention.
Figure 3B:
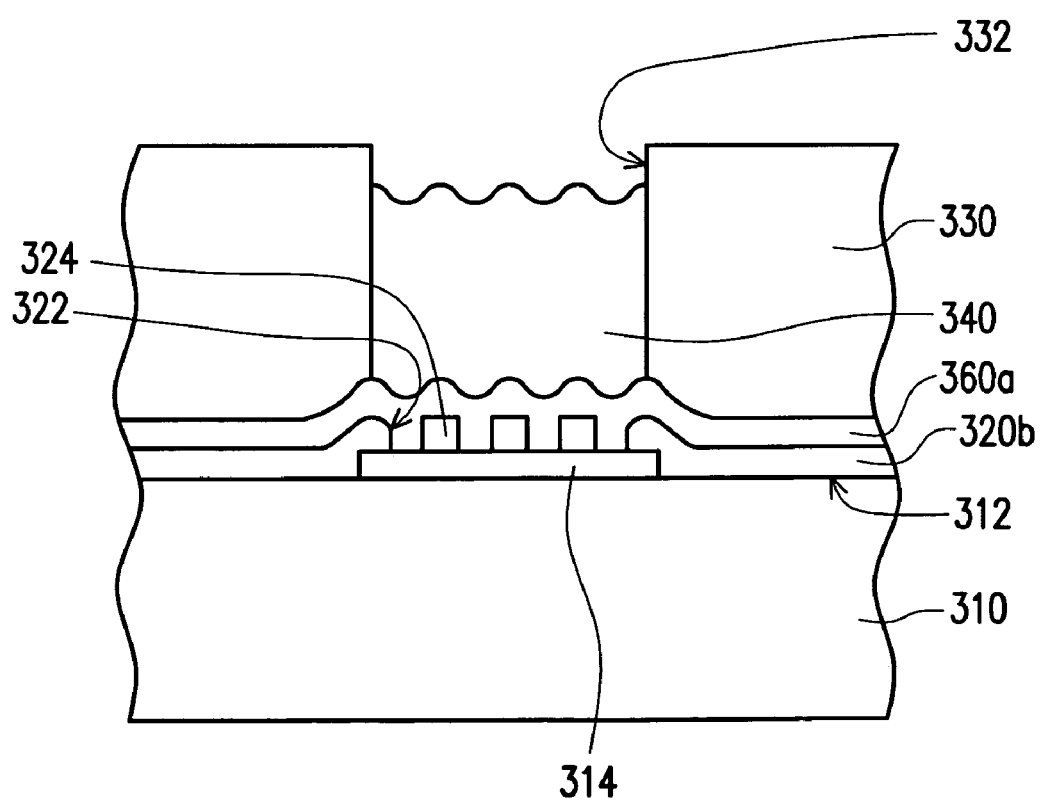
Figure 3C:
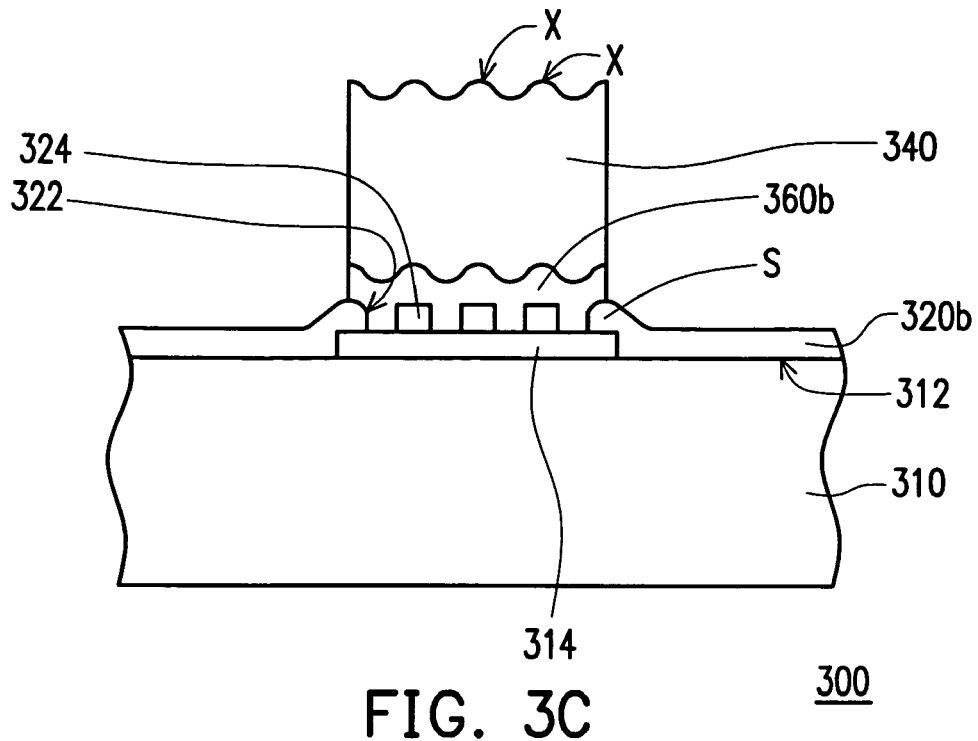

FIGS. 3A-3C are schematic, cross-sectional views showing the steps for fabricating a semiconductor device according to one embodiment of the present invention. As shown in FIG. 3A, an circuit structure 310 is provided, wherein the circuit structure 310 has an active surface 312. The circuit structure 310 has a plurality of contacts 314, disposed on the active surface 312. A layer of protective material 320a is then formed on the active surface 312 and the contacts 314. The protective layer 320a is formed by, for example, screen printing, coating or a direct adhesion of a dry film of the protective material 320a on the active surface 312.

Continuing to FIG. 3B, a protective layer 320b is formed by patterning the protective material 320a via the photolithography and etching processes. The protective layer 320b has a plurality of openings 322 and a plurality of protrusions 324, wherein the openings 322 expose the contacts 314 and the protrusions 324 are configured on the contacts 314. The protrusions 324 on each contact 314 can be ring shape, strip shape, block shape or a combination of the above, for example.

It is important to note that although the disposition of the plurality of the protrusions 324 on a single contact 314 is used in the aforementioned embodiment, the number of the protrusions 324 being configured on a single contact 314 according to this invention is not limited as such. In other embodiments of the present invention, one protrusion 324 is configured on a single contact 314 using an appropriate patterning process. Further, when one protrusion 324 is disposed on a single contact 314, the protrusion 324 can be ring shape, strip shape or block shape, for example.

Thereafter, a layer of under bump metallurgy (UBM) material 360a is formed on the protective layer 320b and the contacts 314. A photoresist layer 330 is then formed over the layer of under bump metallurgy (UBM) material. The photoresist layer 330 is formed by coating, electro deposition, or a direct adhesion of a dry-film photoresist on the protective layer 320b. A plurality of openings 332 is then formed in the photoresist layer 330 via the photolithography and etching processes, wherein the openings 332 expose the UBM material at where the contact 314 are disposed. A bump 340 is then formed in each opening 332 via electroplating, wherein the bump 340 is mechanically and electrically connected to the UBM material 360a. The material of the bump 340 includes, but not limited, to gold.

Continuing to FIG. 3C, the photoresist layer 330 is removed. Further using the bump 340 as a mask, the UBM material 360a that is not covered by the bump 340 is removed to form a plurality of UBM pads 360b. The fabrication of a semiconductor device 300 is thus completed. It is important to note that the thickness of the protective layer 320b is fixed, the height of the bulge S on the protective layer 320b near the opening 322 is substantially the same as the height of the protrusions 324. Accordingly, the top of the bump 340 which is disposed on the contact 314, the protrusions 324 and the bulge S of the protective layer 320b also has a plurality of corresponding bulges X, wherein the height of each bulge X is basically the same.

Figure 4:
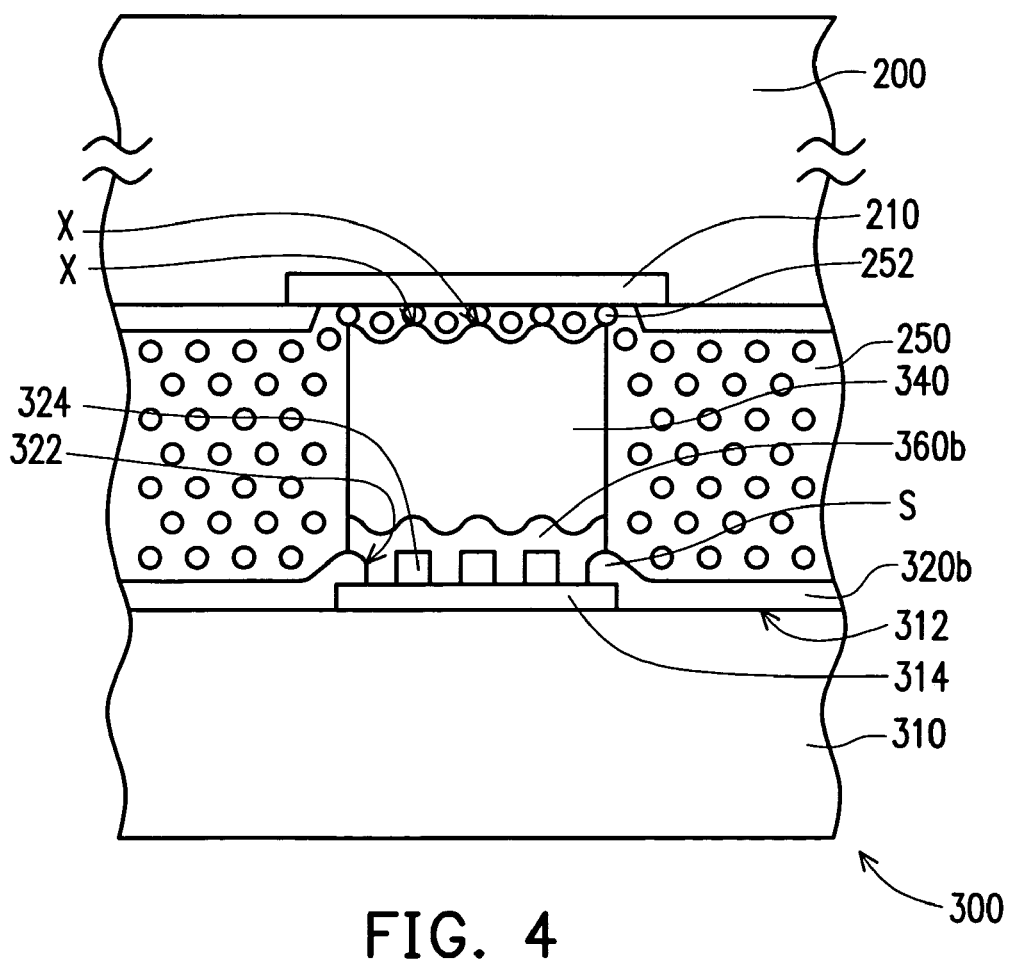
FIG. 4 is a schematic diagram illustrating the electrical connection between the semiconductor device in FIG. 3C and a substrate.

FIG. 4 is a schematic diagram illustrating an electrical connection between a semiconductor device and a substrate. Referring to FIG. 4, a printed circuit board 200 is electrically connected to the circuit structure 310 via the bump 340 and an anisotropic conductive film (adhesive) 250. The anisotropic conductive film (adhesive) 250 has a plural of granules 252 having a conductive interior and insulating exterior. The printed circuit board 200 further includes a plurality of terminals 210.

When the printed circuit board 200 is electrically connected to the circuit structure 310 via the anisotropic conductive film (adhesive) 250 and the bump 340, some of the granules 252 are pressured by the plurality of the bulges X on the surface of the bump 340 and the terminals 210. The insulating exterior of the granules 252 will fracture at where pressure is being applied by the bulges X and the terminals 210 to expose the conductive interior. As a result, the conductive interior of the granules makes an electrical contact with the bump 340 and the terminal 210 at the fracture site. The electrical connection between the circuit structure 310 and the printed circuit board 200 is thereby completed.

Accordingly, the contact of the circuit structure of the present invention has a plurality of protrusions thereon. The bump that covers the contacts also has a plurality of bulges on its top surface, wherein the positions of the bulges correspond to the positions of the protrusions. Further, the thickness of the bulges is substantially the same. As the electric circuit structure is electrically connected to a substrate through these bumps of the present invention, the electrical connection between the bumps of the semiconductor device and the terminals has a higher reliability. This is due to the fact that, in the present invention, the plurality of bulges at the top of the bump can be used to pressure the granules of the anisotropic conductive film (adhesive), whereas, in the prior art, only a single bulge on the gold bump is being relied on to pressure the granules of the anisotropic conductive film.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A semiconductor device, comprising:
    a circuit structure comprising a plurality of contacts; and
    a protective layer, disposed on the circuit structure, wherein the protective layer comprises a plurality of openings exposing the plurality of contacts and a plurality of protrusions located within the plurality of openings and disposed on the plurality of contacts.

2. The semiconductor device of claim 1 further comprising a plurality of under ball metallurgy (UBM) pads and a plurality of bumps, wherein the plurality of UBM pads are disposed on the plurality of contacts and the plurality of protrusions, and the plurality of bumps are disposed on the plurality of UBM pads.

3. The semiconductor device of claim 2, wherein a material of the plurality of bumps comprises gold.

4. The semiconductor device of claim 1, wherein each of the plurality of protrusion is disposed on one of the plurality of contacts.

5. The semiconductor device of claim 4, wherein the plurality of protrusion have a ring shape, a strip shape or a block shape.

6. The semiconductor device of claim 1, wherein at least two of the plurality of protrusions are disposed on one of the plurality of contacts.

7. The semiconductor device of claim 6, wherein the plurality of protrusions have a ring shape, a strip shape, a block shape or a combination thereof.

8. A fabrication method of a semiconductor device, comprising:
    providing a circuit structure, wherein the circuit structure comprises a plurality of contacts;
    forming a layer protective material on the circuit structure; and
    patterning the protective material to form a protective layer, the protective layer comprising a plurality of openings exposing the plurality of contacts and a plurality of protrusions located within the plurality of openings and disposed on the plurality of contacts.

9. The method of claim 8 further comprising forming an under bump material on the plurality of contacts and the plurality of protrusions;
    forming a plurality of bumps on the under bump material, wherein positions of the plurality of bumps correspond to positions of the plurality of contacts, respectively; and
    removing the under bump material not covered by the plurality of bumps.

* * * * *

UNITED STATES PATENT AND TRADEMARK OFFICE
CERTIFICATE OF CORRECTION

PATENT NO. : 7,651,886 B2  Page 1 of 1
APPLICATION NO. : 11/451997
DATED : January 26, 2010
INVENTOR(S) : Jiun-Heng Wang It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 781 days.

Signed and Sealed this

Twenty-third Day of November, 2010

David J. Kappos
*Director of the United States Patent and Trademark Office*